United States Patent
Schulze et al.

(10) Patent No.: US 7,547,561 B2
(45) Date of Patent: Jun. 16, 2009

(54) ADVANCED PROCESS CONTROL MODEL INCORPORATING A TARGET OFFSET TERM

(75) Inventors: Uwe Schulze, Dresden (DE); Martin Mazur, Pulsnitz (DE); Andreas Becker, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 505 days.

(21) Appl. No.: 11/281,997

(22) Filed: Nov. 17, 2005

(65) Prior Publication Data

US 2006/0223203 A1  Oct. 5, 2006

(30) Foreign Application Priority Data

Mar. 31, 2005  (DE) .................. 10 2005 014 796

(51) Int. Cl.
*H01L 21/66* (2006.01)
*H01L 21/312* (2006.01)
*H01L 21/47* (2006.01)

(52) U.S. Cl. ............... 438/14; 438/4; 438/5; 438/780; 430/327; 430/935

(58) Field of Classification Search ............ 438/4, 438/7, 16, 780, 5, 14; 430/327, 935
See application file for complete search history.

(56) References Cited

U.S. PATENT DOCUMENTS

| | | | |
|---|---|---|---|
| 4,778,739 A * | 10/1988 | Protschka ................. 430/30 |
| 6,248,602 B1 * | 6/2001 | Bode et al. ................. 438/14 |
| 6,632,692 B1 | 10/2003 | Hewett et al. ............... 438/18 |
| 6,872,663 B1 * | 3/2005 | Okada ...................... 438/694 |
| 6,905,621 B2 * | 6/2005 | Ho et al. ................... 216/47 |
| 7,084,071 B1 * | 8/2006 | Dakshina-Murthy et al. ....................... 438/717 |
| 2002/0158197 A1 * | 10/2002 | Dana et al. ................ 250/306 |
| 2004/0092126 A1 * | 5/2004 | Yang et al. ................ 438/725 |
| 2004/0121269 A1 * | 6/2004 | Liu et al. .................. 430/329 |
| 2006/0257749 A1 * | 11/2006 | Chang et al. .................. 430/5 |
| 2008/0194097 A1 * | 8/2008 | Kim et al. ................. 438/636 |

FOREIGN PATENT DOCUMENTS

WO  WO 2006/088545 A2  8/2006

* cited by examiner

*Primary Examiner*—M. Wilczewski
(74) *Attorney, Agent, or Firm*—Williams, Morgan & Amerson (57) ABSTRACT

An advanced process control (APC) architecture comprising a process model that incorporates a target offset term is provided. The APC architecture may be applied to a so-called develop inspect critical dimension (DICD) model using the target offset term to correct at least one exposure parameter on the occurrence of an abrupt event. A corresponding event may, for example, concern a modified reflectivity of processed substrates, for example due to a rework of substrates covered by amorphous carbon material.

7 Claims, 5 Drawing Sheets

ADVANCED PROCESS CONTROL MODEL INCORPORATING A TARGET OFFSET TERM

BACKGROUND OF THE INVENTION

1. Field of the Invention

The present invention relates to the field of fabrication of integrated circuits, and, more particularly, to the field of so-called advanced process control (APC).

2. Description of the Related Art

Fabrication of integrated circuits requires the precise formation of very small features with a very small tolerance for error. Such features may be formed in a material layer formed above an appropriate substrate, such as a silicon substrate. These features of precisely controlled size are generated by patterning the material layer by performing known photolithography and etching processes, wherein a masking layer is formed over the material layer to be etched to define these features. Generally, a masking layer may consist of or is formed by means of a layer of photoresist that is patterned by a lithographic process. During the lithographic process, the photoresist may be spin-coated onto the wafer surface and is then selectively exposed to ultraviolet radiation. After developing the photoresist, depending on the type of resist, i.e., positive resist or negative resist, the exposed portions or the non-exposed portions are removed to form the required pattern in the layer of photoresist.

Since the dimensions of the patterns in sophisticated integrated circuits are steadily decreasing, the equipment used for patterning device features have to meet very stringent requirements with regard to resolution and overlay accuracy of the involved fabrication processes. In this respect, resolution is considered as a measure of specifying the consistent ability to print images of a minimum size under conditions of pre-defined manufacturing variations. One important factor in improving the resolution is represented by the lithographic process, in which patterns contained in a photo mask or reticle are optically transferred to the layer of photoresist via an optical imaging system. Therefore, great efforts are made to steadily improve optical properties of the lithographic system and of the material layer to be patterned.

The relevant properties of the lithographic system may be numerical aperture, depth of focus and wavelength of the light source used. The relevant properties of the material layer to be patterned may, for example, be influenced by the type of photoresist used, baking temperature and thickness variations of resist layer, reflectivity of underlying material layer and planarity of underlying layers. The quality of the lithographic imagery is extremely important in creating very small feature sizes.

Of at least comparable importance, however, is the accuracy with which an image can be positioned on the surface of the substrate. Integrated circuits are typically fabricated by sequentially patterning material layers, wherein features on successive material layers bear a spatial relationship to one another. Each pattern formed in a subsequent material layer has to be aligned to a corresponding pattern formed in the previously patterned material layer within specified registration tolerances. This is a particular challenging task due to the typically performed stepper exposure process so that for each exposure field, for example, a single die is exposed separately and the entire substrate is, consequently, exposed step by step in a sequential manner. In addition, not only the exposure process may be affected by non-uniformity problems, but, for example, deposition, etch, implantation and annealing processes may also be concerned.

As the minimum device dimensions, also referred to as critical dimensions (CD), steadily decrease, it is therefore desirable to minimize feature variations not only from wafer to wafer but also across the entire wafer surface to allow semiconductor manufacturers to use processes the tolerances of which may be set more tightly to achieve improved production yield while at the same time enhance device performance in view of, for example, operational speed. Otherwise, the fluctuations across the wafer and the wafer-to-wafer variations may be taken into account, thereby requiring a circuit design that tolerates higher process discrepancies.

In principle, there are two different strategies to overcome the issues caused by the non-uniformities across the wafer and the wafer-to-wafer variations. The non-uniformities may be reduced, for example, by an improved process control or may be compensated for by accordingly modifying a process that may have a compensating effect. An example for compensation of across-wafer non-uniformities is a position-dependent adapted exposure parameter in the gate exposure process to compensate for any position-dependent variations causing variations in the electrical parameters of field effect transistors to be formed. The gate exposure process is typically employed for compensation of non-uniformities across the wafer, as the gate exposure process provides both an effective compensation mechanism and a position-dependent control feasibility, due to the usage of the stepper technique. The position-dependent control may be carried out, for example, by an accordingly adapted so-called exposure map defining exposure parameters for each single exposure step.

On the other hand, for example, gate length variations as patterned may be compensated for position independently, wafer by wafer or lot by lot by adapting the width of subsequently formed gate sidewall spacers accordingly. An example, which does not concern lithography processes, is the compensation of across-wafer non-uniformities during the metallization layer formation, such as the compensation for a non-uniformity of a removal rate of a chemical mechanical polishing (CMP) process by an accordingly adapted plating process forming a corresponding compensating deposition profile.

As mentioned above, an improved process control enables, compared to a compensation technique, a straighter reduction of wafer-to-wafer and across-wafer non-uniformities. Recently, a process control strategy has been introduced and is continuously improved, allowing a high degree of process control, desirably on a run-to-run basis, without the necessity of an immediate response of a measurement tool. In this control strategy, so-called advanced process control, a model of a process or of a group of interrelated processes is established and implemented in an appropriately configured process controller. The process controller also receives information related to the type of process or processes, the product, the process tool or process tools in which the products are to be processed, the process recipe to be used, i.e., a set of required sub-steps for the process or processes under consideration (containing possibly fixed process parameters and variable process parameters), measurement results of previously processed products or test substrates, and the like. From this information, which may also be referred to as history information, and the process model, the process controller determines a controller state or process state that describes the effect of the process or processes under consideration on the specific product.

Figure 1A:
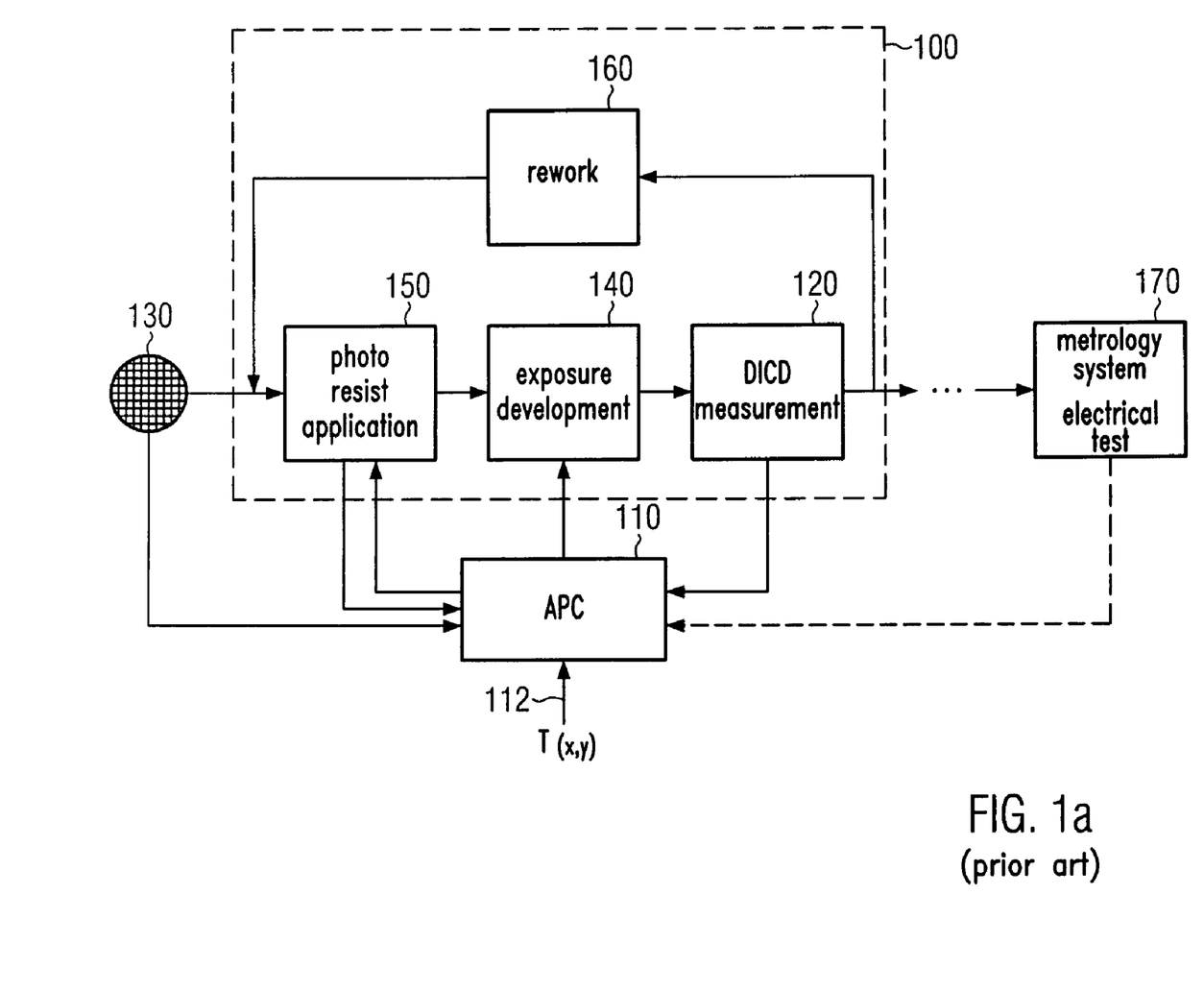
FIG. 1a schematically shows a step and repeat lithography system and a metrology system connected to an APC.
Figure 1B:
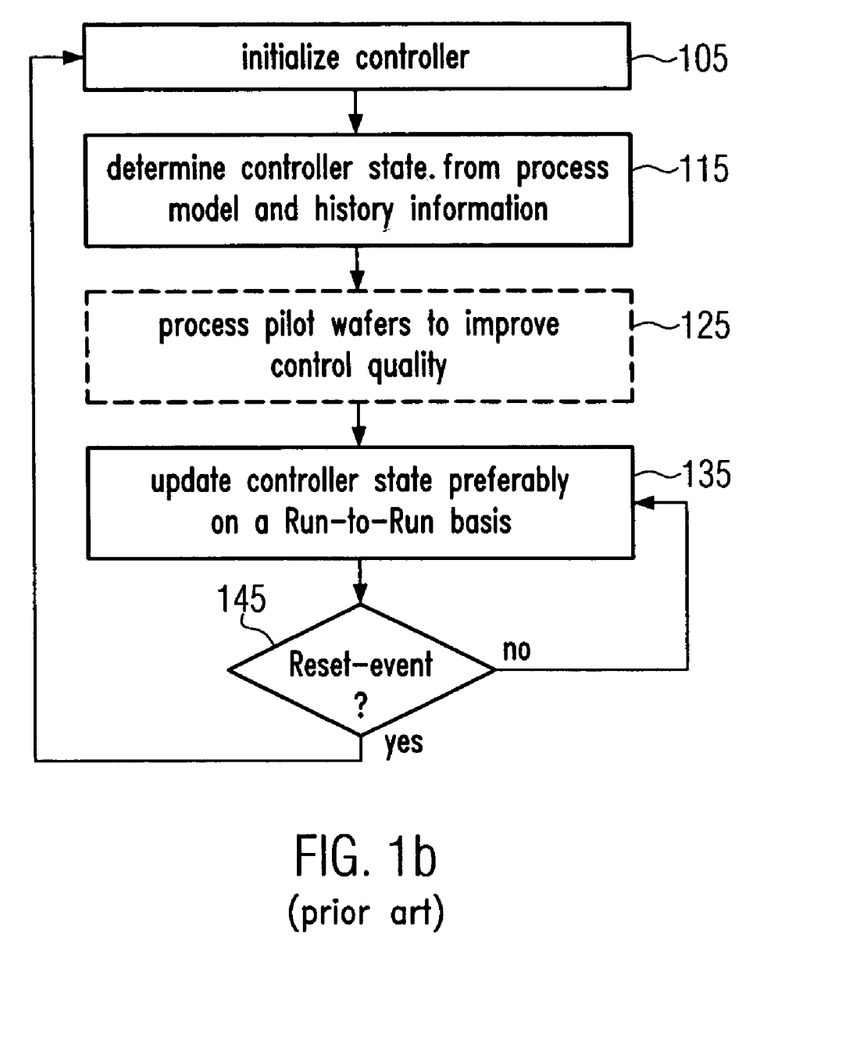

With reference to FIGS. 1a and 1b, an illustrative example of an advanced process control (APC) will now be described. FIG. 1a schematically shows an APC architecture that is exemplified for a photolithography process. A photolithography station 100 comprises a photoresist application module 150, a stepper exposure and development module 140, a develop inspect critical dimension (DICD) module 120 and a rework module 160. An advanced process controller 110 is operatively connected to the photolithography station 100. Moreover, the process controller 110 is configured to receive information from the photo-resist application module 150 and from the DICD module 120 of the photolithography station 100. Furthermore, the process controller 110 may receive information related to a product substrate 130 to be processed by the photolithography station 100 and from the product substrate 130 at a later process step, for example, from a metrology tool and/or an electrical test station 170, and information related to a critical dimension (CD) target value T(x,y) 112 that may be provided position dependently.

In operation, a photoresist layer is formed on the product substrate 130 in the photo-resist application module 150 according to a conventional technique, typically, by a spin-on technique. In the module 140, the substrate 130 is exposed by well known exposure techniques, typically by a deep ultraviolet light source, and the exposed resist layer is developed. Subsequently, the developed resist layer is subjected to a DICD measurement to assess the quality of the exposure process. In case the DICD tolerances do not meet the requirements, the substrate may be subjected to a rework process, wherein the developed resist is removed from the substrate to repeat the photolithography process with accordingly adapted parameters. The rework of substrates removing a photoresist layer does, in general, not unduly affect the substrate so that the photolithography process may be repeated several times in case of exposure failures. The reflectivity of amorphous carbon, which may be employed in metallization layers of modern semiconductor devices due to their low permittivity, may, however, be modified during the rework process. Thus, the photolithography of reworked substrates comprising amorphous carbon layers may be affected.

The advanced process control of the system shown in FIG. 1a will be explained with reference to the flowchart shown in FIG. 1b. In step 105, the process controller 110 is initialized, i.e., the process controller 110 is set to an initial process state. A process state in this example may represent, for instance, the state of the exposure light source. The process state may also represent the reflectivity of the substrate surface and/or the type and thickness of the photoresist. Since, generally, the amount of history information available upon initialization of the process controller 110 may not be sufficient to determine a process state, the initial state is set in advance and selected so that the effect of the tool is expected to be within the process specifications. The product substrate 130 is then processed with process parameters adjusted on the basis of the initial process state.

In step 115, the process controller 110 determines a process state on the basis of the process model implemented and the history information received from, for example, the metrology system 170, the photolithography station 100, a further product substrate 130 to be processed and the corresponding CD target values. It should be noted that, in particular, the measurement results obtained from the metrology tool 170 may be delayed or may even not be available unless a plurality of product substrates 130 is completely processed. Thus, the process controller 110 establishes the currently valid process state on the basis of the available information and the process model to "predict" the effect of the photolithography process on the product to be processed and to adjust process parameters correspondingly to achieve the predicted effect. For example, the process controller 110 may estimate the maximum intensity of the exposure light source from the available information, such as the number of products that has already been processed, type of process to be performed and the like, and estimate the "state" of the process and correspondingly adjust a process parameter, for example the exposure time, to obtain the specified process result. In other processes, the process state may represent the removal rate of a CMP tool, the etch rate in an etch tool, the deposition rate in a deposition tool, and so on.

As indicated in step 125, the determination of the process state may require the processing of one or more pilot substrates to improve control quality, since the accuracy of the determined process state may significantly depend on the available history information, the amount and the accuracy of which increases with an increasing number of processed products.

In step 135, the process state is updated, that is, a new or advanced process state is determined on the basis of the previous process states, including the previously obtained history information. Preferably, the advanced process state is established on a run-to-run basis, that is, prior to processing an individual product 130, the corresponding process state is established, and on the basis of the currently valid process state, the process parameter(s) may accordingly be adjusted.

As indicated in step 145, the process flow continuously updates the process state when no reset event occurs. Generally, process control quality improves as the amount of history information increases, unless the history information indicates that predefined specifications are no longer met. For instance, the lifetime of the exposure light source has expired or will soon expire, reworked substrates, in particular when covered with amorphous carbon layers, are processed, the type of photoresist is to be changed, the type of product is to be changed, the CD target value has to be changed and the like. Any of these events may render the process state unpredictable and, therefore, the process controller 110 is re-initialized with the initial state set in advance, and the process continues as depicted in FIG. 1b on the basis of newly gathered history information after the reset event. Even if these events do not require a re-initialization of the controller, the adaptation to the resultant new controller state may affect the process quality in the transition phase.

It should be noted that the system shown and described with reference to FIG. 1a is only an illustrative example, wherein the process controller 110 is connected to a single process station. However, the process controller 110 may be configured to perform several control operations with a plurality of different product types and process recipes, as well as with more than one process system.

Although the advanced process control, as exemplarily described above, provides significant advantages compared with process controls based on, for example, measurement mean values, the occurrence of abrupt events conventionally requires a re-adaptation lasting a period that may concern several substrates, or a re-initializing (reset events) of the process controller, resulting in a reduced process quality in an early state after the re-initialization and also possibly requiring the processing of additional pilot substrates.

Any adaptation to abrupt events and re-initialization, however, reduces the process capability due to a wider range of tolerances of the process during the period of adaptation or after the re-initialization, and entails a reduced throughput due to the processing of pilot wafers and a reduced yield caused by a higher probability of device failures.

In view of the above-identified problems, a need exists to provide an improved advanced process control strategy, in particular for a lithography process, wherein one or more of the above constraints may be avoided or at least reduced.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to an advanced process control technique that enables taking into account an abrupt but known modification in process parameters by incorporating an corresponding target offset term or error correction term into the process control model.

According to one illustrative embodiment of the present invention, a method comprises providing a processed substrate having a rework status representative of a number of rework processes performed on the substrate and exposing a photoresist layer provided above the substrate, wherein at least one exposure parameter is determined by an advanced process controller at least on the basis of the rework status provided.

According to another illustrative embodiment, a method comprises exposing a photoresist layer formed above a first substrate, developing the photoresist layer and obtaining information about the developed photoresist layer representative of a process status. The method further comprises providing a second substrate having a rework status representative of a number of rework processes being performed on the substrate, and determining at least one exposure parameter for a photoresist layer formed on the second substrate on the basis of the information and of the rework status.

According to yet another illustrative embodiment of the present invention, a method comprises providing an advanced process controller comprising a process model comprising a target term and a target offset term. The method further comprises updating the target offset term on occurrence of an event and determining at least one process parameter from the process model.

BRIEF DESCRIPTION OF THE DRAWINGS

The invention may be understood by reference to the following description taken in conjunction with the accompanying drawings, in which like reference numerals identify like elements, and in which:

FIG. 1b schematically shows a process flowchart of the APC of FIG. 1a;

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 2A:
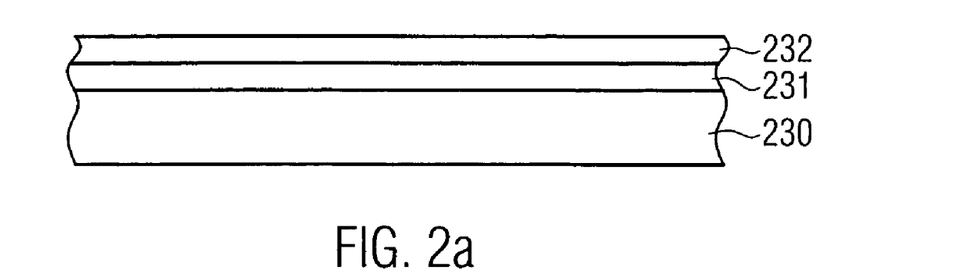
FIG. 2a schematically shows a substrate employed in an embodiment of the present invention.

With reference to FIGS. 2a-2c and FIG. 3, further illustrative embodiments of the present invention will now be described. FIG. 2a schematically depicts a semiconductor substrate 230 that may be utilized in embodiments of the present invention. An amorphous carbon layer 231 is formed above the substrate 230 and a photoresist layer 232 is formed on the amorphous carbon layer 231. The amorphous carbon layer 231 may by formed by conventional deposition techniques, for instance, by chemical vapor deposition (CVD). The amorphous carbon layer 231 may, for example, serve as an anti-reflective coating (ARC) or a dielectric layer of an interconnection structure. The photoresist layer 232 may be formed by well-known photoresist spin-coat techniques.

The substrate 230 may represent a bulk semiconductor substrate, an insulating substrate having formed thereon a crystalline semiconductor layer (not shown) and the like. For instance, the substrate 230 may represent a bulk silicon substrate having formed thereon, for example as an upper portion thereof, a crystalline semiconductor region (not shown) which may be comprised of silicon, silicon/germanium and the like. The substrate 230 may also be provided as a silicon-on-insulator (SOI) substrate. It should be appreciated that the present invention may readily be applied to any appropriate semiconductor material, such as gallium arsenide, germanium, or any other III-V or II-VI semiconductor materials, although the vast majority of logic circuitry is presently manufactured on the basis of silicon. The substrate may comprise a plurality of devices (not shown), e.g., CMOS devices which may form, for example, an integrated circuit.

Figure 2B:
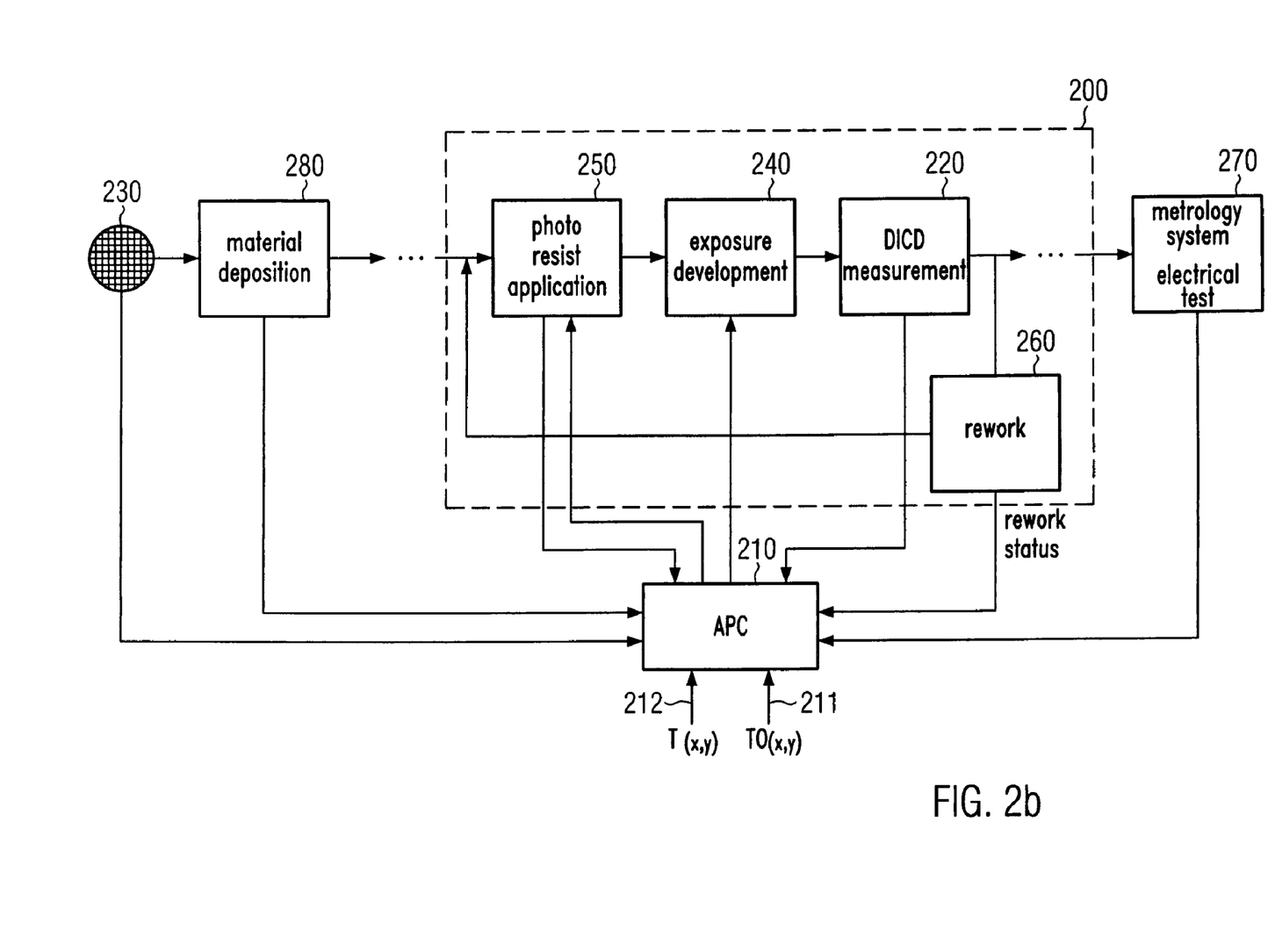
FIG. 2b schematically shows a step and repeat lithography system, a material deposition tool and a metrology system connected to an APC according to an embodiment of the present invention.

FIG. 2b schematically depicts a semiconductor production line or at least a portion thereof comprising an APC architecture, which in one illustrative embodiment is implemented in a photolithography system. A photolithography station 200 comprises a photoresist application module 250, a stepper exposure and development module 240, a develop inspect critical dimension (DICD) module 220 and a rework module 260 that is, contrary to the rework module 160 of FIG. 1a, connected to a process controller 210. The controller 210 is further operatively connected to the photolithography station 200. Moreover, the process controller 210 is configured to receive information from the resist application module 250, from the DICD module 220 and from the rework module 260 of the photolithography station 200. Furthermore, the process controller 210 may receive information related to a product substrate 230 to be processed by the photolithography station 200, from process tools, for example a deposition tool 280, and/or from the product substrate 230 at a later process step, for example from a metrology tool and/or an electrical test station 270, and information related to a critical dimension (CD) target value T(x,y) 212 and a target offset value TO(x,y) 211 which may be provided in a position-dependent form.

In operation, the product substrate 230 may be processed, for example, in the deposition tool 280, for example to form a dielectric material layer, for example of amorphous carbon. An appropriate photoresist layer is subsequently formed on the product substrate 230 in the resist application module 250 according to a conventional technique. In the module 240, the substrate 230 is exposed by well-known exposure techniques, typically by a deep ultra-violet light source, and the exposed photoresist layer is developed. Subsequently, the developed photoresist layer is subjected to a DICD measurement to assess the quality of the exposure process. In case the DICD tolerances do not meet the requirements, the substrate may be subjected to a rework process to repeat the photolithography process with accordingly adapted parameters. A rework status indicating, for instance, the number of rework processes performed on the substrate to be processed in the lithography system 200 may be provided to the APC 210. The corresponding advanced process control of the system shown in FIG. 2b will be explained with reference to the flowchart shown in FIG. 2c.

Figure 2C:
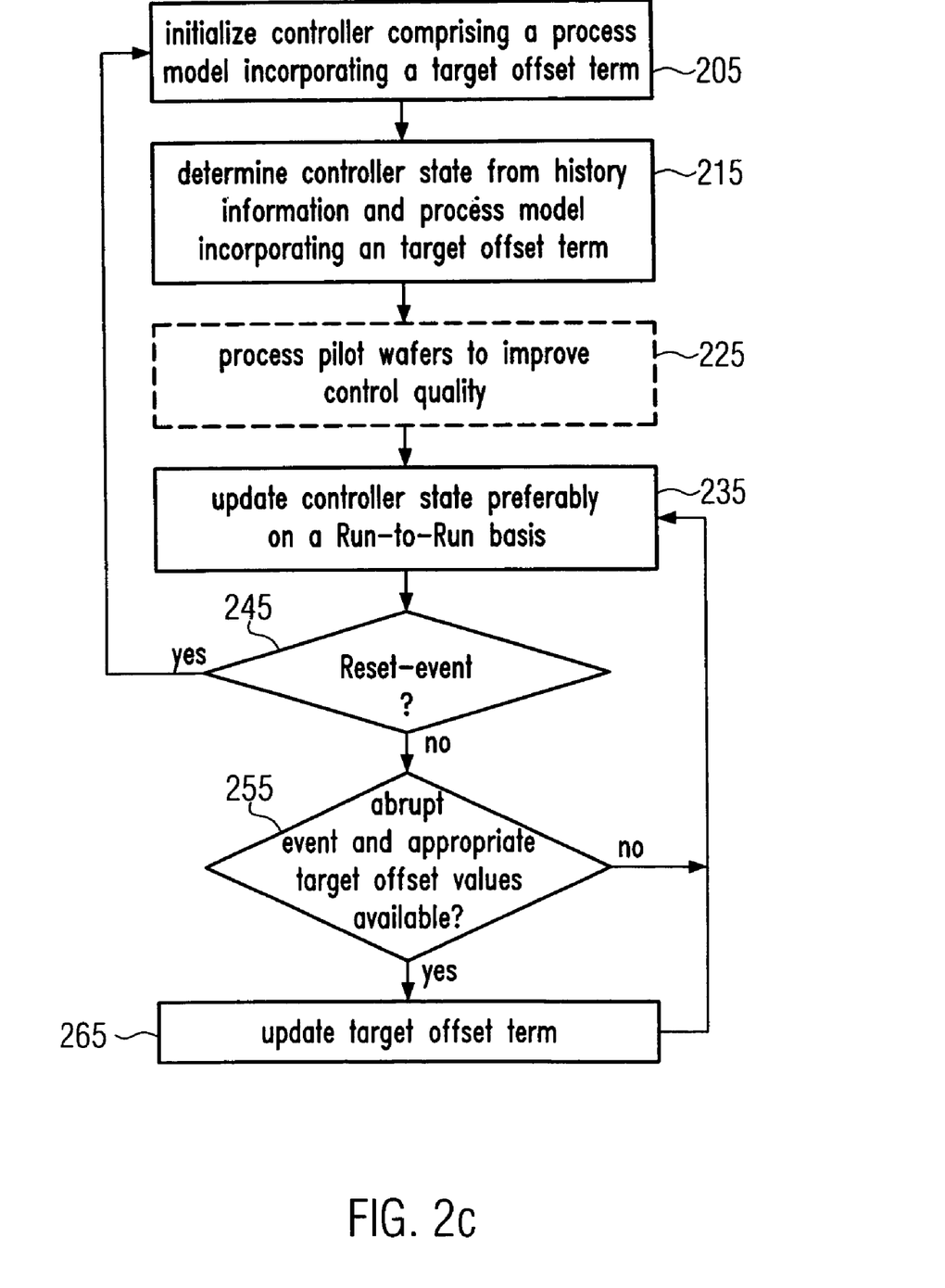
FIG. 2c schematically shows a corresponding process flowchart of the APC of FIG. 2b.

The initialization step, indicated by block 205, the controller state determination step, indicated by block 215, and the pilot wafer processing step, indicated by block 225, may be performed as described with respect to steps indicated by blocks 105, 115 and 125 of FIG. 1b, respectively, wherein, contrary thereto, the process model incorporates a target offset term that may comprise an appropriate value. In one embodiment, for example, the target offset term may be initially set to zero to obtain a process state representation according to the prior art. In other processes, the process state, as stated with respect to the described prior art, may represent the removal rate of a CMP tool, the etch rate in an etch tool, the deposition rate in a deposition tool, etc.

In the step indicated by block 235, the process state is updated, similarly as set forth with respect to the step indicated by block 135 of FIG. 1a, while additionally taking the additional target offset term into account.

As indicated in the step referred to by block 245, the process controller 210 is re-initialized with the initial state set in advance and the process continues as depicted in FIG. 2c on the basis of newly gathered history information after the reset event as described with respect to the step indicated by block 145 of FIG. 1b.

As indicated by block 255, when no reset event occurs, contrary to the step indicated by block 145 of FIG. 1b, the controller state update of block 235 is performed with unmodified model parameters, when no abrupt event or an unknown (no appropriate target offset values specified) abrupt event occurs.

As indicated by block 265, when, however, a known event occurs, i.e., an appropriate target offset value or error correction value for this event is specified, the process model target offset term may be accordingly adjusted and the subsequent process state updates are performed with the new target offset value. In this context, a known abrupt event, for example, may represent a change in the rework status of the substrates 230 to be processed in a photolithography system 200. The rework status is of particular relevance for substrates covered with an amorphous carbon layer since the reflectivity of amorphous carbon layers may be modified by a rework process. The altered reflectivity of an amorphous carbon layer may be taken into account by an accordingly adapted target offset value of the target offset term of the process model. The corresponding target offset values may be determined by data analyses, for example, of DICD measurements of reworked substrates, and by specific test runs. Different target offset values may be obtained for repeated rework processes performed on a single substrate dependent on the number of performed rework processes. Typically, at least a lot of, for instance, 25 reworked substrates is processed to improve the lithography accuracy compared to a single processing of a reworked substrate. In another embodiment, the target offset term may also be employed to account for a known drift of a process parameter of the exposure process, for example, a varying maximum intensity of the light source exposing the resist layer.

The target offset term may also be employed to improve the adaptation of other advanced process control operations performed in semiconductor manufacturing, for example in a CMP process to account for known abrupt events, for example, a variation of the down force and/or of the relative speed between a substrate to be polished and a polishing pad. In another embodiment, the target offset term may also be used to account for a known drift of a process parameter, for example of a decreasing abrasive capability of a conditioning surface of a pad conditioner. In this case, an accordingly varying target offset value may be defined, for example, on the basis of a measurement data analyses of critical dimension measurement of developed photoresist features.

For any process model for advanced process control of a process performed on a plurality of substrates, the process model relates the process input X with the process output Y. A process may, for instance, be described by a linear model $$Y(n)=\gamma(n)*X(n)+b(n+1) \qquad (1)$$

wherein γ is a sensitivity parameter that specifies the effect of a variation of the input X on the process output Y. The sensitivity parameter γ may be fixed at least for a plurality of substrates and may be determined by corresponding test runs. The parameter b represents the actual controller state.

Based on the linear model, a new input parameter X(n+1) for the substrate to be processed subsequently may be determined from the previous input parameter setting X(n) and the resulting previous output value Y(n) by $$X(n+1)=X(n)+\{T(n+1)-Y(n)\}/\gamma \qquad (2)$$

wherein T is the specified output target value.

A new input parameter X(n+1)* may be calculated by means of a weighted moving average from the new input parameter X(n+1) determined in (2) and the previous input parameter X(n) by $$X(n+1)^* = \lambda X(n+1) + (1-\lambda)X(n) \quad (3)$$

wherein λ is a parameter in the range of 0-1. The choice of λ is usually ad-hoc with higher values resulting in more aggressive control. That means the "speed" of adaptation of the control swing with respect to the foregoing development of the output parameter may be adjusted. Thus, an appropriate weighting parameter λ may improve the stability of the advanced control system.

On the other hand, however, due to the usage of an exponentially-weighted moving average, the system requires a certain adaptation period that may result in a reduced transition performance of the controlled system. For known abrupt events, for example a change in the rework status of a lot of substrates, the transition to the new parameter settings is improved by incorporating a target offset term into the APC process model. An appropriate target offset value TO may be determined by test runs or by measurement data analyses. The process model incorporating the target offset term may be expressed $$X(n+1) = X(n) + \{T(n+1) + TO(n+1) - TO(n) - Y(n)\}/\gamma \quad (4)$$

wherein TO(n) and TO(n+1) represent the target offset values for the substrate n and n+1, respectively.

In case the new process model is applied to a advanced process control of an lithography process, the input parameter X may specify an exposure E and the output parameter Y may specify a critical dimension of a developed photoresist feature DICD. The target term T may specify a target DICD and the target offset term TO may specify a target offset DICD value. Thus, equation (4) becomes $$E(n+1) = E(n) + \{T(n+1) + TO(n+1) - TO(n) - \mathrm{DICD}(n)\}/\gamma \quad (5)$$

and equation (3) becomes $$E(n+1)^* = \lambda E(n+1) + (1-\lambda)E(n) \quad (6)$$

In a notation combining equations (5) and (6), the formula for an exponentially-weighted moving average of an exposure parameter of an advanced process control may be represented by $$E(n+1) = \mathop{EWMA}_{i=n}^{i=0}[E(i) + \{T(n+1) + TO(n+1) - TO(i) - DICD(i)\}/\gamma] \quad (7)$$

The process characteristics relating to the target offset value may, in general, vary in dependence of the position on the substrate. The reflectivity of a reworked substrate covered with an amorphous carbon layer, for example, may vary due to thickness or planarity non-uniformities of an underlying layer that may be caused, for example, by a non-uniformity of a previously performed CMP process. Thus, in an embodiment, a position-dependent target value and/or target offset value is provided.

The exposure module 240 is typically provided as a stepper, which performs a step and repeat or step and scan exposure on a substrate, wherein a plurality of die or exposure fields are sequentially exposed. Each exposure step may be carried out on the basis of an individually adjusted set of exposure parameters that are commonly referred to as an exposure map. The exposure map may include one or more tool-specific parameters determining the characteristics of each individual exposure step. Examples of conventional tool-specific parameters may be alignment parameters, depth of focus, exposure time and the like. In addition, the exposure map may be employed to store and provide the position-dependent target and/or target offset values.

Figure 3:
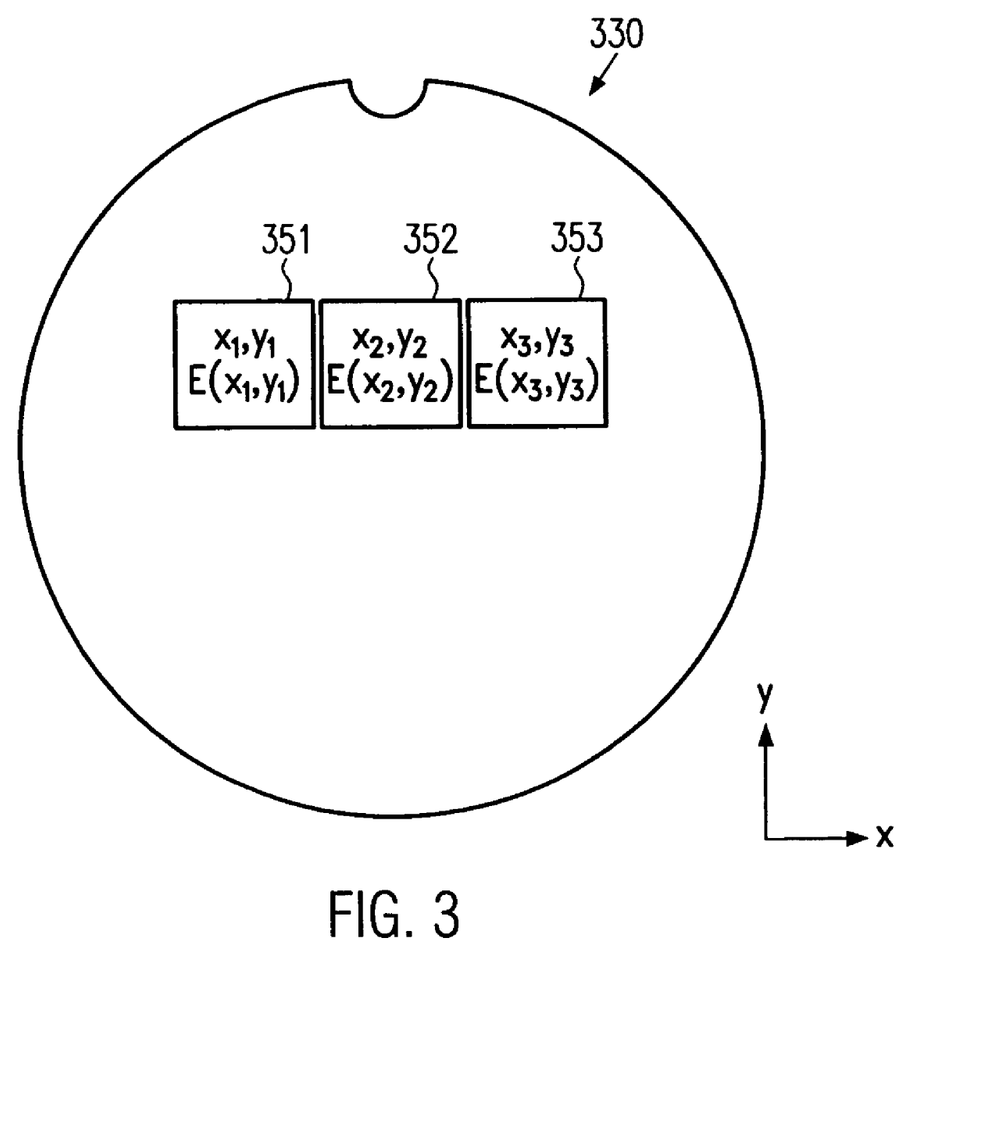
FIG. 3 schematically shows a substrate having formed thereon a plurality of exposure fields created by a exposure map according to one illustrative embodiment of the present invention.

FIG. 3 schematically shows a substrate 330 that is processed by the photolithography system 200 of FIG. 2b. The substrate 330 includes exposure fields 351, 352, 353 located at positions $\{x_1,y_1\}$, $\{x_2,y_2\}$ and $\{x_3,y_3\}$, respectively, wherein the coordinates $x_i$, $y_i$ may refer to predefined reference points of the substrate 330 and the exposure fields 351, 352, 353. For example, the position $\{x_1,y_1\}$ may refer to the upper left corner of the exposure field 351 with respect to the center of the substrate 330. However, any other choice for a reference system may be appropriate. Each of the exposure fields has been exposed to the radiation of the photolithography system 200 that is characterized by the exposure map, indicated as E, wherein one or more parameter values of the exposure map may vary with position so that the exposure map E is a function of position and will be written as E=E(x, y).

The quality of circuit elements may be improved by using a control process in forming circuit features of critical dimension, wherein advantage is taken of the step and repeat or step and scan exposure process that allows adaptation of exposure parameters to specified locations on the substrate. The exposure parameter may be updated in a highly dynamic fashion in that in-line parameters at one or more manufacturing stages of the circuit feature (prior to and/or after the exposure process) are used to re-adjust the exposure parameters, thereby effectively compensating for substrate internal non-uniformities, for example, for reflectivity non-uniformities of reworked substrates.

Moreover, the above control scheme may also be used to improve the quality of circuit elements not only with respect to substrate internal non-uniformities, but also with respect to substrate-to-substrate or lot-to-lot deviations.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    providing a processed substrate having a rework status representative of a number of rework processes performed on said substrate; and
    exposing a photoresist layer provided above said substrate, wherein at least one exposure parameter is determined by an advanced process controller at least on the basis of said rework status, wherein said advanced process controller comprises a process model comprising a target value and a target offset value to correct a time-dependent variation.

2. The method of claim 1, wherein said target offset value represents an abrupt event.

3. The method of claim 2, wherein said target offset value represents said rework status of said substrate.

4. The method of claim 3, wherein said target offset value is obtained from test runs.

5. The method of claim 3, wherein said target offset value is obtained from data analyses performed on critical dimension measurement data of developed photoresist features.

6. The method of claim 2, wherein at least one of said target value and said target offset value further depends on the position on said substrate.

7. The method of claim 6, wherein said at least one of said target value and said target offset value is listed in an exposure map.

\* \* \* \* \*